(12) United States Patent
Honda et al.

(10) Patent No.: US 12,289,944 B2
(45) Date of Patent: Apr. 29, 2025

(54) LIGHT-EMITTING ELEMENT AND DISPLAY DEVICE

(71) Applicant: SHARP KABUSHIKI KAISHA, Sakai (JP)

(72) Inventors: Daisuke Honda, Sakai (JP); Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 583 days.

(21) Appl. No.: 17/637,249

(22) PCT Filed: Sep. 2, 2019

(86) PCT No.: PCT/JP2019/034459
§ 371 (c)(1),
(2) Date: Feb. 22, 2022

(87) PCT Pub. No.: WO2021/044495
PCT Pub. Date: Mar. 11, 2021

(65) Prior Publication Data
US 2022/0285644 A1    Sep. 8, 2022

(51) Int. Cl.
*H01L 51/50* (2006.01)
*H10K 50/125* (2023.01)
*H10K 50/15* (2023.01)
*H10K 50/16* (2023.01)
*H10K 59/12* (2023.01)
*H10K 102/00* (2023.01)

(52) U.S. Cl.
CPC .......... *H10K 50/125* (2023.02); *H10K 50/15* (2023.02); *H10K 50/16* (2023.02); *H10K 59/12* (2023.02); *H10K 2102/331* (2023.02)

(58) Field of Classification Search
None
See application file for complete search history.

(56) References Cited

U.S. PATENT DOCUMENTS

| | | |
|---|---|---|
| 2007/0103068 A1 | 5/2007 | Bawendi et al. |
| 2010/0108984 A1 | 5/2010 | Cho et al. |
| 2010/0283034 A1* | 11/2010 | Qu ........................ H10K 50/115 257/14 |
| 2012/0238047 A1 | 9/2012 | Bawendi et al. |
| 2012/0292595 A1 | 11/2012 | Bawendi et al. |
| 2013/0092885 A1* | 4/2013 | Cho ........................ H01L 29/22 977/773 |
| 2017/0125635 A1 | 5/2017 | Bawendi et al. |

(Continued)

FOREIGN PATENT DOCUMENTS

| | | | | |
|---|---|---|---|---|
| CN | 105684555 A | * | 6/2016 | ........... C09K 11/025 |
| EP | 2530719 A2 | * | 12/2012 | ......... A61K 47/6923 |

(Continued)

*Primary Examiner* — Jarrett J Stark
(74) *Attorney, Agent, or Firm* — ScienBiziP, P.C.

(57) ABSTRACT

A light-emitting element includes: an electron transport layer; a hole transport layer; and a light-emitting layer between the electron transport layer and the hole transport layer, the light-emitting layer including: quantum dots; and ligands coordinated to the quantum dots, wherein the ligands in the light-emitting layer have a lower concentration on an electron transport layer side of the light-emitting layer than on a hole transport layer side of the light-emitting layer.

13 Claims, 5 Drawing Sheets

(56) References Cited

U.S. PATENT DOCUMENTS

2018/0166643 A1\* 6/2018 Kim ..................... H10K 59/879
2020/0119298 A1\* 4/2020 Kim ..................... H10K 50/125
2020/0321547 A1\* 10/2020 Wu ....................... H10K 50/80

FOREIGN PATENT DOCUMENTS

| JP | 2009-087755 A |   | 4/2009 |
| JP | 2010-114079 A |   | 5/2010 |
| JP | 2012-023388 A |   | 2/2012 |
| JP | 2013-089969 A |   | 5/2013 |
| JP | 2021005479 A | \* | 1/2021 |

\* cited by examiner

| CHARACTERISTIC PARAMETER | UNIT | MEASURED VALUE |
|---|---|---|
| $V_{th}$ | V | 3.3 |
| $V_l$ | V | 3.5 |
| $L_{max}$ | $cd/m^2$ | 50000 |
| $J_{max}$ | $ma/cm^2$ | 300 |
| $EQE_{max}$ | % | 18 |

| CHARACTERISTIC PARAMETER | UNIT | MEASURED VALUE |
|---|---|---|
| $V_{th}$ | V | 3 |
| $V_l$ | V | 3.5 |
| $L_{max}$ | $cd/m^2$ | 50000 |
| $J_{max}$ | $ma/cm^2$ | 500 |
| $EQE_{max}$ | % | 10 |

LIGHT-EMITTING ELEMENT AND DISPLAY DEVICE

TECHNICAL FIELD

The present invention relates to light-emitting elements and display devices.

RELATED ART

Patent Literature 1, as an example, discloses a light-emitting element containing semiconductor nanocrystals and an inorganic substance in a light-emitting layer and a charge transport layer thereof.

CITATION LIST

Patent Literature

Patent Literature 1: Japanese Unexamined Patent Application Publication, Tokukai, No. 2012-23388

SUMMARY

Technical Problem

There is room for improvement in the luminous efficiency of the light-emitting element disclosed in Patent Literature 1 if electrons and holes are efficiently injected to the light-emitting layer.

The disclosure, in an aspect thereof, has an object to provide a technique of improving the luminous efficiency of a light-emitting element containing quantum dots, by efficiently injecting electrons and holes to a light-emitting layer thereof.

Solution to Problem

To accomplish this object, the disclosure, in an aspect thereof, is directed to a light-emitting element including: an electron transport layer; a hole transport layer; and a light-emitting layer between the electron transport layer and the hole transport layer, the light-emitting layer including: quantum dots; and ligands coordinated to the quantum dots, wherein the ligands in the light-emitting layer have a lower concentration on an electron transport layer side of the light-emitting layer than on a hole transport layer side of the light-emitting layer.

To accomplish this object, the disclosure, in an aspect thereof, is directed to a display device including: a substrate; a thin film transistor on the substrate; and a light-emitting element electrically connected to the thin film transistor, the light-emitting element including: an electron transport layer; a hole transport layer; and a light-emitting layer between the electron transport layer and the hole transport layer, the light-emitting layer including: quantum dots; and ligands coordinated to the quantum dots, wherein the ligands in the light-emitting layer have a lower concentration on an electron transport layer side of the light-emitting layer than on a hole transport layer side of the light-emitting layer.

Advantageous Effects

The disclosure, in an embodiment thereof, can achieve efficient injection of electrons and holes in a light-emitting element containing quantum dots in a light-emitting layer thereof and can hence improve the luminous efficiency of the light-emitting element containing quantum dots in the light-emitting layer thereof.

DESCRIPTION OF EMBODIMENTS

Figure 1:
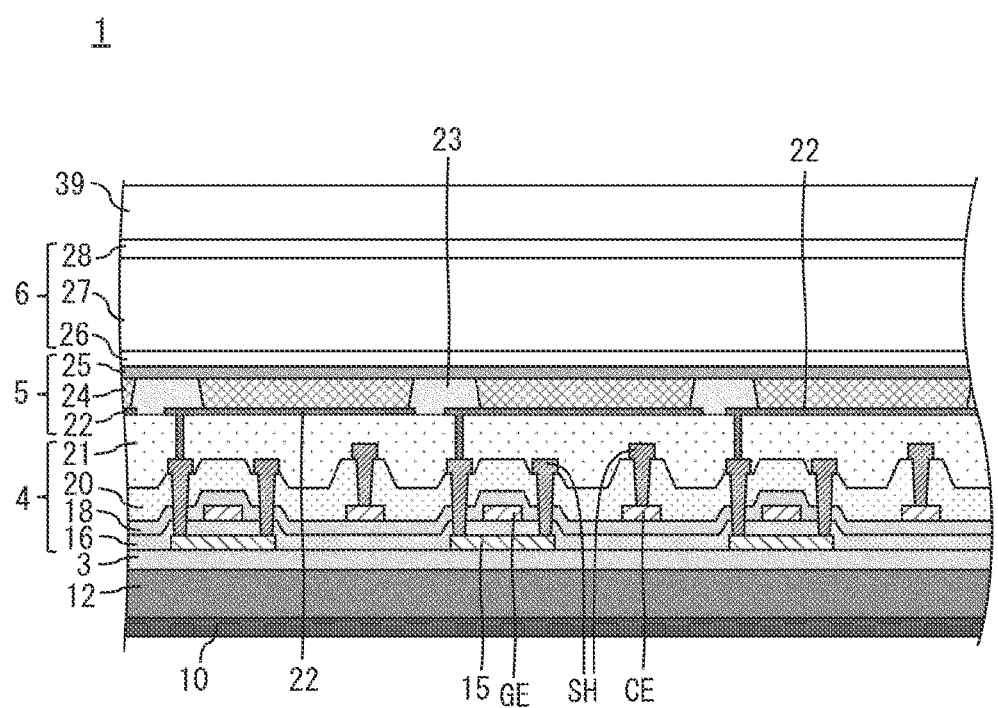
FIG. 1 is a cross-sectional view of an exemplary structure of a display device including light-emitting elements in accordance with a first embodiment.

The following will describe illustrative embodiments of the disclosure with reference to drawings. Throughout the following description, expressions like "component A overlies/is on or above component B" indicate that component A is formed in a later process or step than component B. Identical or equivalent members are denoted by the same reference numerals throughout the drawings, and their description may not be repeated.

First Embodiment

FIG. 1 is a cross-sectional view of an exemplary structure of a display device 1 including light-emitting elements 5 in accordance with a first embodiment. The display device 1 in accordance with the present embodiment is a QLED (quantum-dot light-emitting diode) panel in which the light-emitting elements 5 containing quantum dots are provided on a resin layer 12 that is a flexible substrate. The display device 1 may alternatively be structured such that the light-emitting elements 5 are provided on a rigid substrate such as a glass substrate. Referring to FIG. 1, the display device 1 in accordance with the present embodiment includes the resin layer 12, thin film transistors ("TFT's") 4, the light-emitting elements 5, and a sealing layer 6.

The resin layer 12 contains, for example, polyimide. The resin layer 12 may be replaced by a sequential stack of a resin film (e.g., polyimide film), an inorganic insulation film (e.g., silicon oxide film, silicon nitride film, or silicon oxynitride film), and a resin film (e.g., polyimide film). There is also provided a bottom face film 10 on the bottom face of the resin layer 12 in the present embodiment as shown in FIG. 1. There is also provided a barrier layer 3 on the top face of the resin layer 12.

The bottom face film 10 is, for example, a PET film attached to the bottom face of the resin layer 12, so that the resultant light-emitting element can be highly flexible. The barrier layer 3 prevents foreign materials such as water and oxygen from reaching the TFT's 4 and the light-emitting elements 5. The barrier layer 3 may include, for example, a silicon oxide film, a silicon nitride film, a silicon oxynitride film, or a stack of these films. The films can be formed by CVD.

Each TFT 4 includes, for example: a semiconductor film 15; an inorganic insulation film 16 (gate insulation film) overlying the semiconductor film 15; a gate electrode GE and a gate line (not shown) connected to the gate electrode both overlying the inorganic insulation film 16; an inorganic insulation film 18 overlying the gate electrode GE and the gate line; a capacitor electrode CE overlying the inorganic insulation film 18; an inorganic insulation film 20 overlying the capacitor electrode CE; a source line SH overlying the inorganic insulation film 20; and a planarization film 21 (interlayer insulation film) overlying the source line SH.

The semiconductor film 15 is made of, for example, a low-temperature polysilicon (LTPS) or an oxide semiconductor (e.g., In—Ga—Zn—O-based semiconductor). The TFT 4 is structured so as to contain the semiconductor film 15 and the gate electrode GE. FIG. 1 shows an example where the TFT 4 has a top-gate structure. Alternatively, the TFT 4 may have a bottom-gate structure or a double-gate structure.

The gate electrodes GE, the gate lines, the capacitor electrodes CE, and the source lines SH are made of, for example, a monolayer or multilayered film of at least one of metals of aluminum, tungsten, molybdenum, tantalum, chromium, titanium, and copper. In the example of FIG. 1, the TFT 4 includes a single semiconductor layer and three metal layers.

The inorganic insulation films 16, 18, and 20 may be made of, for example, a silicon oxide ($SiO_x$) film or a silicon nitride ($SiN_x$) film formed by CVD or a stack of these films. The planarization film 21 is a resin layer that can be made of, for example, an organic material, such as polyimide or acrylic, that can be provided by printing or coating technology.

The light-emitting element 5 includes an anode 22, a functional layer 24, and a cathode 25. The functional layer 24 includes a hole transport layer 241, a light-emitting layer 242, and an electron transport layer 243. The light-emitting element 5 is provided on the planarization film 21 and electrically connected to the TFT 4. The structure of the light-emitting element 5 will be detailed later.

The sealing layer 6 is transparent and includes, for example: an inorganic sealing film 26 covering the cathode 25; an organic layer including an organic buffer film 27 overlying the inorganic sealing film 26; and an inorganic sealing film 28 overlying the organic buffer film 27. The sealing layer 6, covering the light-emitting elements 5, prevents foreign materials such as water and oxygen from reaching the light-emitting elements 5.

The inorganic sealing film 26 and the inorganic sealing film 28 are inorganic insulation films and may each include, for example, a silicon oxide film, a silicon nitride film, a silicon oxynitride film, or a stack of these films. The films can be formed by CVD.

The organic buffer film 27 is a transparent organic film that has a planarization effect. The organic buffer film 27 may be made of an organic material, such as acrylic, that can be provided by printing or coating technology. The organic buffer film 27 may be formed, for example, by inkjet printing. There may be provided a bank in the non-display area to stop liquid drops. In the display device 1 in accordance with the present embodiment, there is provided a functional film 39 on the inorganic sealing film 28. The functional film 39 is a flexible substrate and has, for example, at least one of an optical compensation function, a touch sensor function, and a protection function.

Figure 2:
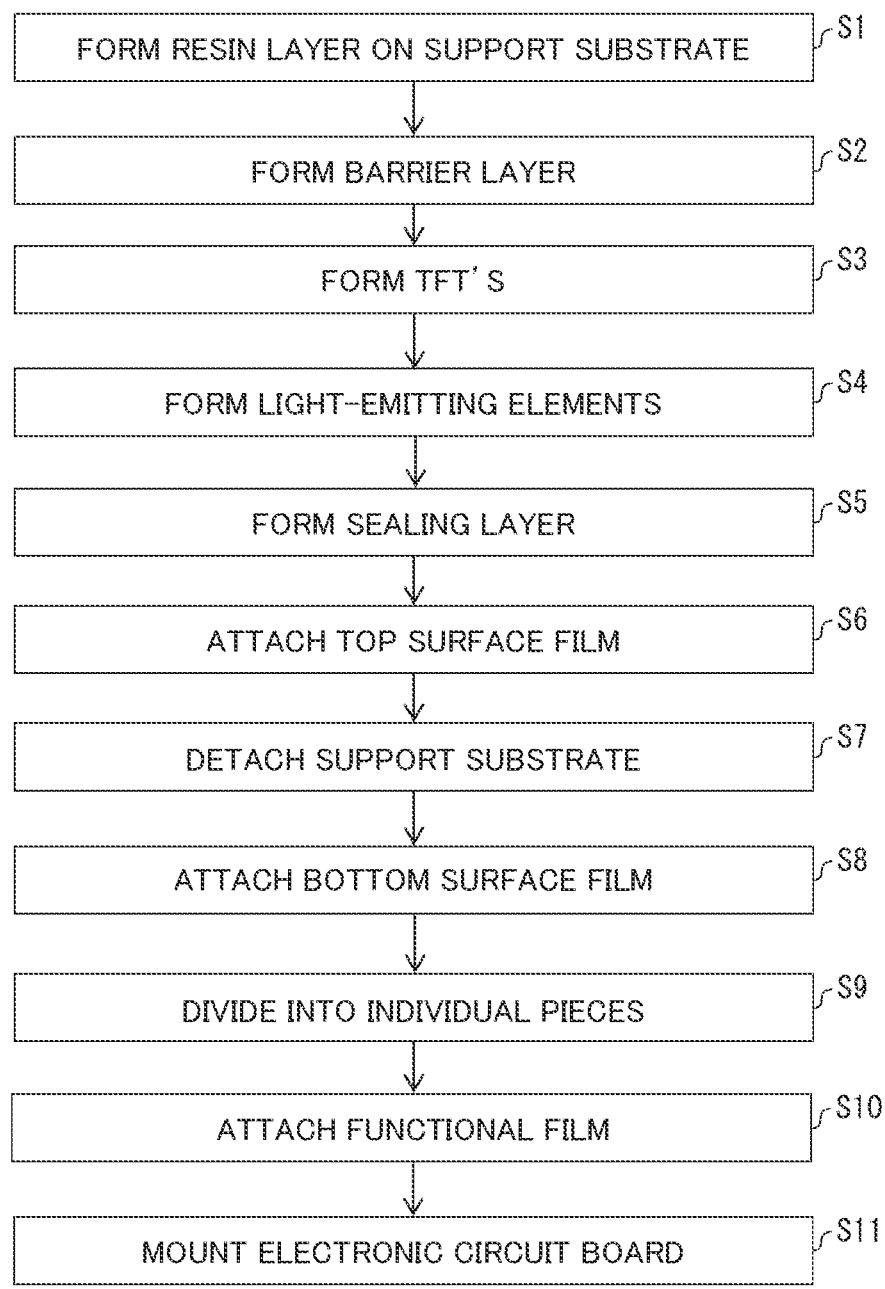
FIG. 2 is a flow chart representing an exemplary method of manufacturing a display device including light-emitting elements in accordance with the first embodiment.

Now, a description is given of a method of manufacturing the display device 1 in accordance with the present embodiment. FIG. 2 is a flow chart representing an exemplary method of manufacturing the display device 1 including the light-emitting elements 5 in accordance with the first embodiment.

To manufacture the display device 1, first, the resin layer 12 is formed on a transparent support substrate (e.g., mother glass) as shown in FIGS. 1 and 2 (step S1). Next, the barrier layer 3 is formed (step S2). The thin film transistors (TFT's) 4 are then formed (step S3). Next, the top-emission light-emitting elements 5 are formed (step S4). Subsequently, the sealing layer 6 is formed (step S5). A top face film is then attached to the sealing layer 6 (step S6).

Next, the support substrate is detached from the resin layer 12 by laser irradiation (step S7). Next, the bottom face film 10 is attached to the bottom face of the resin layer 12 (step S8). Next, a stack body of the bottom face film 10, the resin layer 12, the barrier layer 3, the TFT's 4, the light-emitting elements 5, and the sealing layer 6 is divided to obtain individual pieces (step S9). Next, the functional film 39 is attached to the resultant individual pieces (step S10). Thereafter, an electronic circuit board (e.g., an IC chip and an FPC) is mounted to a portion (terminal section) outside a display area where there is provided a plurality of subpixels (a non-display area or a frame) (step S11), which concludes the manufacture of the display device 1 in accordance with the present embodiment. Steps S1 to S11 are carried out by a manufacturing machine for the display device 1 (including a film-forming machine for steps S1 to S5). A method of manufacturing the light-emitting elements 5 will be described later in detail.

The description has so far focused on the flexible display device 1. To manufacture a non-flexible display device, for example, stacking steps S2 to S5 are carried out on a glass substrate before the manufacturing process proceeds to step S9, because it is generally unnecessary to, for example, form a resin layer and reattach base members.

Figure 3:
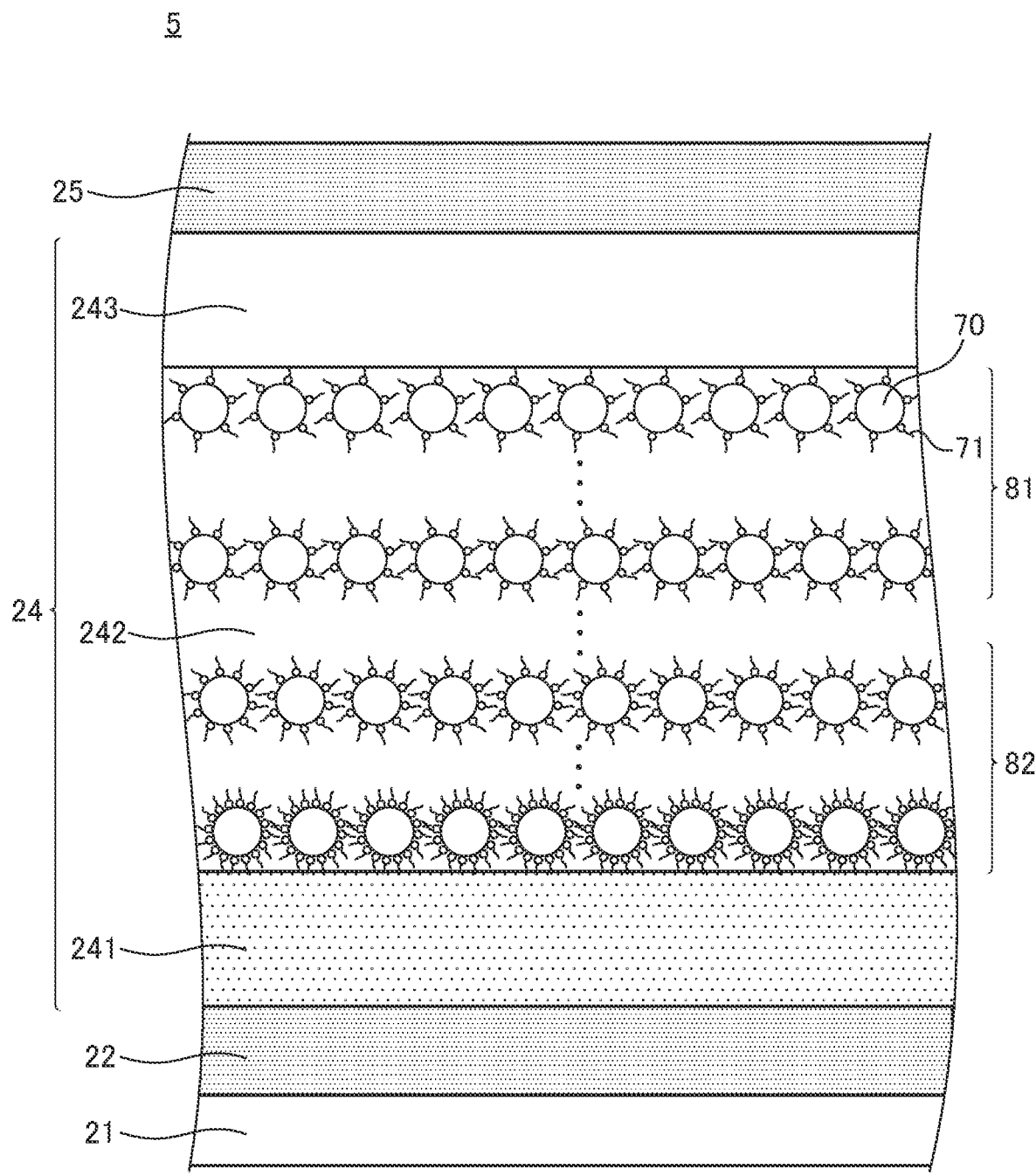
FIG. 3 is a cross-sectional view of an exemplary structure of a light-emitting element in accordance with the first embodiment.

A description is now given of a method of manufacturing the light-emitting elements 5 and the structure of the light-emitting element 5. FIG. 3 is a cross-sectional view of an exemplary structure of the light-emitting element 5 in accordance with the first embodiment.

The light-emitting element 5 in accordance with the present embodiment includes the anode 22, the functional layer 24, and the cathode 25 as described above. The functional layer 24 in accordance with the present embodiment includes the hole transport layer 241, the light-emitting layer 242, and the electron transport layer 243. Specifically, as shown in FIGS. 1 and 3, the light-emitting element 5 in accordance with the present embodiment includes the anode 22 overlying the planarization film 21, an insulating cover film 23 covering the edge of the anode 22, the functional layer 24 overlying the cover film 23, and the cathode 25 overlying the functional layer 24. The cover film 23 is formed, for example, by patterning an applied organic material such as polyimide or acrylic by photolithography. The light-emitting element 5, including the insular anode 22, the functional layer 24, and the cathode 25, is provided for each subpixel. A subpixel circuit is formed in the TFT 4 to control the light-emitting element 5.

The anode 22 is formed in an insular manner on the planarization film 21 and electrically connected to the source line SH via a contact hole in the planarization film 21. The anodes 22 are formed by, for example, sputtering or vapor deposition. The anodes 22 are made of, for example, a stack of ITO (indium tin oxide) and either Ag or a Ag-containing alloy so that the anodes 22 can reflect light. The anodes 22 may alternatively be made of a metal such as Al, Cu, Au, or Ag or an alloy containing at least one of these metals. As another alternative, the anodes 22 may be made of a stack of such an alloy and ITO.

The hole transport layer 241 is formed on the anodes 22. The hole transport layer 241 is formed by, for example, sputtering or vapor deposition. The hole transport layer 241 includes, for example, a film of a metal oxide such as NiO, $Cr_2O_3$, MgO, MgZnO, $LaNiO_3$, $MoO_3$, or $WO_3$. The hole transport layer 241 may alternatively be made of an organic film such as PEDOT-PSS, PVK, or TFB. The hole transport layer 241 may be formed by inkjet technology.

The light-emitting layer 242 resides between the hole transport layer 241 and the electron transport layer 243. Referring to FIG. 3, the light-emitting layer 242 in accordance with the present embodiment includes quantum dots 70 and ligands 71 coordinated to the quantum dots 70.

Each quantum dot 70 has a valence band and a conduction band and emits light because of recombination of the holes occupying the top of the valence band and the electrons occupying the bottom of the conduction band. The light emitted by the quantum dot 70 has a narrow spectrum due to the three-dimensional quantum confinement effect, so that the light exhibits deep chromaticity. The quantum dot 70 in accordance with the present embodiment includes, for example, a core and a shell covering the core. The ligands 71 are coordinately bonded to the outer surface of the shell.

The core of the quantum dot 70 is made of, for example, CdSe, InP, ZnSe, or CIGS (a compound formed primarily of copper, indium, gallium, and selenium). The shell of the quantum dot 70 is made of, for example, ZnS. The structure of the light-emitting layer 242 will be described later in more detail.

The electron transport layer 243 resides on the light-emitting layer 242. The electron transport layer 243 is formed by, for example, sputtering, vapor deposition, or coating. The electron transport layer 243 includes, for example, a film of a metal oxide such as $TiO_2$, ZnO, ZAO (aluminum-added ZnO), ZnMgO, ITO, or IGZO® (InGaZnO$_x$). The electron transport layer 243 may alternatively include a conductive polymer such as $Alq_3$, BCP, or t-Bu-PBD.

The cathodes 25 reside on the electron transport layer 243. The cathodes 25 are formed by, for example, sputtering or vapor deposition. The cathodes 25 are transparent electrodes including, for example, a film of a metal oxide such as IGZO, ITO, or IZO. The cathodes 25 may alternatively include such a thin film of a metal such as Al or Ag that the cathodes 25 can transmit light.

The holes injected from the anode 22 and the electrons injected from the cathode 25 are transported to the light-emitting layer 242 through the electron transport layer 243 and the hole transport layer 241 respectively. The holes and electrons transported to the light-emitting layer 242 conduct through the ligand 71 and recombine in the core of the quantum dot 70, which results in the quantum dot 70 emitting light. The light-emitting element 5 in accordance with the present embodiment is an example of a top-emission element where the light emitted by the light-emitting layer 242 leaves the element through a side opposite from the substrate (through the top in FIGS. 1 and 3). Alternatively, the light-emitting element 5 may be a bottom-emission element where the light leaves the element through the TFT 4 side (through the bottom in FIGS. 1 and 3), in which case the cathode 25 includes a reflective electrode made of Ag or a Ag-containing alloy, and the anode 22 includes a transparent electrode, as an example.

The light-emitting element 5 in accordance with the present embodiment includes the anode 22, the hole transport layer 241, the light-emitting layer 242, the electron transport layer 243, and the cathode 25, all stacked in this sequence when viewed from the substrate. Alternatively, the light-emitting element 5 may have a so-called inverted structure where the light-emitting element 5 includes the cathode 25, the electron transport layer 243, the light-emitting layer 242, the hole transport layer 241, and the anode 22, all stacked in this sequence when viewed from the substrate.

A description is now given of the structure of the light-emitting layer 242 in more detail. Referring to FIG. 3, the light-emitting layer 242 in accordance with the present embodiment includes the quantum dots 70 and the ligands 71 coordinated to the quantum dots 70. In the light-emitting layer 242, the ligands 71 have a lower concentration near the electron transport layer 243 than near the hole transport layer 241. In other words, the number of the ligands 71 coordinated to the quantum dots 70 per quantum dot 70 near the electron transport layer 243 is smaller than the number of the ligands 71 coordinated to the quantum dots 70 per quantum dot 70 near the hole transport layer 241.

The light-emitting layer 242 in accordance with the present embodiment has a first area 81 toward the electron transport layer 243 and a second area 82 toward the hole transport layer 241 as shown in FIG. 3. The ligands 71 have a lower concentration in the first area 81 than in the second area 82. The conduction of carriers (holes and electronic) in the first area 81 is therefore restrained in comparison to the conduction in the second area 82. Hence, the first area 81 exhibits a lower conductivity than does the second area 82. In other words, the first area 81 has a higher resistivity than does the second area 82.

The electrons injected from the cathode 25 are restrained in the first area 81 from conducting into the light-emitting layer 242. The excess electrons that do not contribute to recombination therefore are restrained in the first area 81 from conducting into the light-emitting layer 242. Meanwhile, the holes injected from the anode 22 conduct into the light-emitting layer 242, but are restrained in the first area 81 from further conducting and approaching the cathode 25, thereby efficiently recombining with electrons in the light-emitting layer 242. This mechanism improves the charge-carrier balance between the electrons injected from the cathode 25 and the holes injected from the anode 22 in the light-emitting layer 242, which in turn improves the luminous efficiency of the light-emitting element 5.

In the light-emitting layer 242 in accordance with the present embodiment, the first area 81 at least occupies half or less of the thickness of the light-emitting layer 242 toward the electron transport layer 243. Meanwhile, the second area at least occupies less than half the thickness of the light-emitting layer 242 toward the hole transport layer 241. Letting A represent the concentration of the ligands 71 in the first area 81 and B represent the concentration of the ligands 71 in the second area 82, the concentration A and the concentration B satisfy the relation, $B/A > 4$. Under these conditions, the first area 81 has a resistivity of 10 Ω·cm or higher, and the second area 82 has a resistivity of 0.1 Ω·cm or lower. The first area 81, in which the recombination of holes and electrons is suppressed, exhibits a lower light-emission luminance than does the second area 82. For instance, the light-emission luminance of the second area 82 is 36% or less of the light-emission luminance of the first area 81. This structure enables improving the charge-carrier balance while restraining decreases in the luminance in the light-emitting layer 242. That in turn enables further improving the luminous efficiency of the light-emitting element 5.

The conductivities of the first area 81 and the second area 82 can be obtained by, for example, EBIC (electron beam induced current) measurement. EBIC measurement is a technique for measuring a minute current produced by carriers in a sample under electron beam radiation. The carriers generated by electron beam radiation on the light-emitting layer 242 move to the electron transport layer 243 and the hole transport layer 241 under the built-in electric field produced between the light-emitting layer 242 and the electron transport layer 243 and between the light-emitting layer 242 and the hole transport layer 241 when the Fermi levels match, thereby producing a minute current. The conductivity is obtained by measuring the minute current in the first area 81 and the second area 82.

The concentration and quantity of the ligands 71 in the light-emitting layer 242 can be obtained by, for example, XPS (X-ray photoelectron spectroscopy) or TEM-EDS (transmission electron microscope).

In the light-emitting layer 242 in accordance with the present embodiment, the quantum dots 70 have the same concentration in the first area 81 as in the second area 82. The terms, "same" and "equal," here may mean substantially the same and substantially equal respectively and allow for, as an example, errors of approximately ±5%. The concentration of the quantum dots 70 in the first area 81 and the second area 82 can be obtained by, for example, XPS (X-ray photoelectron spectroscopy) or TEM-EDS (transmission electron microscope).

The light-emitting layer 242 preferably has a thickness of, for example, from 10 nm to 50 nm, both inclusive. The light-emitting layer 242 has a minimum thickness dictated by the sum of the particle diameters of the quantum dots 70 across the thickness of the light-emitting layer 242. The particle diameters of the quantum dots 70 are determined depending on the emission wavelength. For instance, the particle diameters of the quantum dots are decreased with a decrease in the wavelength of the light to be emitted by the quantum dots, from red to green to blue.

The quantum dots 70 used to emit blue light, which has the shortest wavelength, have a particle diameter of approximately 5 nm in the light-emitting element 5 in accordance with the present embodiment. Therefore, the light-emitting layer 242 preferably has a minimum thickness of 10 nm. This structure allows for reducing the usage of materials used in preparing the light-emitting layer 242 including the first area 81 and the second area 82 even when, for example, the quantum dots 70 in the light-emitting layer 242 have particle diameters as small as approximately 5 nm. In other words, similarly to the previous examples, this structure can improve the charge-carrier balance between the electrons injected from the cathode 25 and the holes injected from the anode 22 in the light-emitting layer 242, which in turn improves the luminous efficiency.

If the first area 81 has a thickness larger than half the thickness of the light-emitting layer 242, the decrease in the light-emission luminance becomes more influential in the light-emitting layer 242 than the improvement of the charge-carrier balance. The benefits of the improvement of the luminous efficiency thereby become less than satisfactory. Accordingly, the thickness of the first area 81 is preferably half or less of the thickness of the light-emitting layer 242. In addition, the first area 81 preferably has a minimum thickness of 5 nm as described above. This structure can improve the charge-carrier balance of the light-emitting layer in the light-emitting layer 242, thereby further improving the luminous efficiency.

Figures 4, 5, 6:
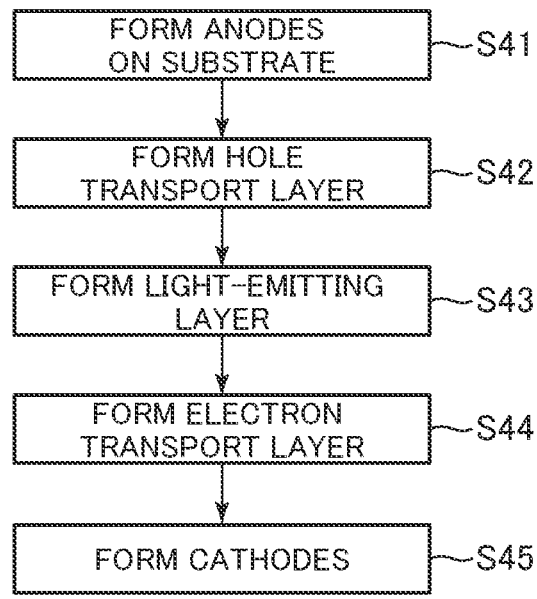
FIG. 4 is a flow chart representing an exemplary method of manufacturing a light-emitting element in accordance with the first embodiment.
FIG. 5 is a diagram of device properties of the light-emitting element in accordance with the first embodiment.
FIG. 6 is a diagram of device properties of a light-emitting element in accordance with a comparative example.

A description is now given of a method of manufacturing the light-emitting elements. FIG. 4 is a flow chart representing an exemplary method of manufacturing the light-emitting elements 5 in accordance with the first embodiment.

To form the light-emitting elements 5 in accordance with the present embodiment, the anodes 22 are first formed on the planarization film 21 on the resin layer 12 (substrate) as shown in FIGS. 3 and 4 (step S41). Next, the hole transport layer 241 is formed on the anodes 22 (step S42).

Next, the light-emitting layer 242 is formed on the hole transport layer 241 (step S43). Specifically, to form the light-emitting layer 242, a stack body including a stack of quantum dots 70 is formed by first applying, using inkjet technology, a colloidal solution prepared by dispersing the quantum dots 70 including the ligands 71 in an organic solvent such as hexane or toluene and then volatilizing the organic solvent. The colloidal solution may additionally contain a dispersant such as a thiol or an amine, which facilitates the dispersion of the quantum dots 70 in the colloidal solution.

Next, the light-emitting layer 242 is formed by oxidizing the stack body. The oxidation in accordance with the present embodiment is performed by, for example, heating the stack body in an atmosphere of a prescribed oxygen concentration after the stack body is formed. The oxygen concentration is, for example, 5% in the oxidation in accordance with the present embodiment.

Some of the ligands 71 in the stack body are removed by the oxidation. The effects of the oxidation gradually diminish from near the electron transport layer 243 to near the hole transport layer 241. The concentration of the ligands 71 in the light-emitting layer 242 therefore gradually decreases from near the electron transport layer 243 to near the hole transport layer 241. The ligands 71 coordinated to those quantum dots 70 residing near the electron transport layer 243 are of the same type as the ligands 71 coordinated to those quantum dots 70 residing near the hole transport layer 241. This structure facilitates the manufacture of the light-emitting elements 5 with improved luminous efficiency.

The ligand 71 in accordance with the present embodiment is made of an organic material. Specifically, the ligand 71 in accordance with the present embodiment contains an amine, a thiol, or a fatty acid. Examples of the amine in the ligand 71 include octylamine, hexadecylamine, octadecylamine, and oleylamine. Examples of the thiol in the ligand 71 include dodecanethiol and hexadecanethiol. Examples of the fatty acid in the ligand 71 include lauric acid, mystiric acid, palmitic acid, and oleic acid. Other examples of the organic material in the ligand 71 include TOPO (trioctylphosphine oxide) and TOP (trioctylphosphine).

Since the ligand 71 in accordance with the present embodiment is made of an organic material as described here, the number of carbon atoms per molecule of the ligand 71 toward the electron transport layer 243 is equal to the number of carbon atoms per molecule of the ligand 71 toward the hole transport layer 241. This structure enables more readily removing the ligands 71 in the oxidation, which further facilitates the manufacture of the light-emitting elements 5 with improved luminous efficiency.

It is inferred that the stack body is progressively oxidized in the oxidation by the following mechanism. The oxidation of the stack body proceeds due to the diffusion of oxygen from the atmosphere outside the stack body and is therefore rate-controlled by the oxygen diffusion. The oxygen diffusion is driven here by a concentration gradient produced by the difference between the oxygen concentration in the atmosphere outside the stack body and the oxygen concentration inside the stack body. Therefore, the oxygen diffusion distance in the thickness of the stack body is inferred to follow a diffusion equation.

The diffusion equation, despite being a partial differential equation of time and location, can be analytically solved. The time-dependent terms in the diffusion equation follow the square root of the time taken by the diffusion distance to diffuse. For instance, in a semiconductor process, the thickness of the oxide film on the surface of a Si substrate is controlled through the square root of the oxidation time. Likewise, in the present embodiment, the thickness of an oxidized region of the stack body is controlled through the square root with respect to the oxygen diffusion time.

Next, the electron transport layer 243 is formed on the light-emitting layer 242 (step S44). Specifically, to form the electron transport layer 243 in accordance with the present embodiment, a colloidal solution is first prepared in which $TiO_2$ nanoparticles are dispersed in a medium. The colloidal solution is then applied to the light-emitting layer 242 by inkjet technology, and the medium in the colloidal solution is heated and hence vaporized. The electron transport layer 243 of $TiO_2$ is hence formed on the light-emitting layer 242. Subsequently, the cathodes 25 are formed on the electron transport layer 243 (step S45), which completes the manufacture of the light-emitting elements 5.

Alternatively, a resist in which $TiO_2$ nanoparticles are dispersed may be used in place of the colloidal solution in which $TiO_2$ nanoparticles are dispersed. As another alternative, another coating technique such as spin-coating or spraying may be used in place of inkjet technology. The electron transport layer 243 may be formed by sputtering using a $TiO_2$ target. The electron transport layer 243 may be formed by reactive sputtering using a Ti target and oxygen. The electron transport layer 243 may be formed by applying and subsequently heating a $TiO_2$ precursor or a solution containing a $TiO_2$ precursor.

FIG. 5 is a diagram of device properties of the light-emitting element 5 in accordance with the present embodiment. FIG. 6 is a diagram of device properties of a light-emitting element including a light-emitting layer containing quantum dots and ligands, the ligands being uniformly distributed in the light-emitting layer (comparative example). In FIGS. 5 and 6, Vth is the cut-in voltage for current in the current-voltage characteristics, Vl is the cut-in voltage for luminance in the voltage-luminance characteristics, Lmax is a maximum light-emission luminance, Jmax is a current density at the maximum light-emission luminance, and EQEmax is a maximum external quantum efficiency.

FIGS. 5 and 6 show that Jmax has a smaller value in the light-emitting element 5 in accordance with the present embodiment than in the light-emitting element in accordance with the comparative example and also that EQEmax has a larger value in the light-emitting element 5 in accordance with the present embodiment than in the light-emitting element in accordance with the comparative example. These figures demonstrate that the light-emitting element 5 in accordance with the present embodiment exhibits an improved luminous efficiency over the light-emitting element in accordance with comparative example.

The light-emitting element 5 in accordance with the present embodiment has Vl and Lmax values that are equivalent respectively to the Vl and Lmax values of the light-emitting element in accordance with the comparative example. Meanwhile, the light-emitting element 5 in accordance with the present embodiment has a Vth value that is 0.3 volts larger (i.e., closer to the VI value) than the Vth value of the light-emitting element in accordance with the comparative example. These figures demonstrate that in the light-emitting element 5 in accordance with the present embodiment, the presence of the first area 81 in the light-emitting layer 242 restrains the electrons that do not contribute to the emission of light from being injected, but does not affect the injection of holes. In other words, the figures demonstrate that the charge-carrier balance between electrons and holes is improved in the light-emitting element 5 in accordance with the present embodiment.

Second Embodiment

A second embodiment is described next. The description is focused on differences from the first embodiment and may not repeat the same content as the first embodiment.

Figure 7:
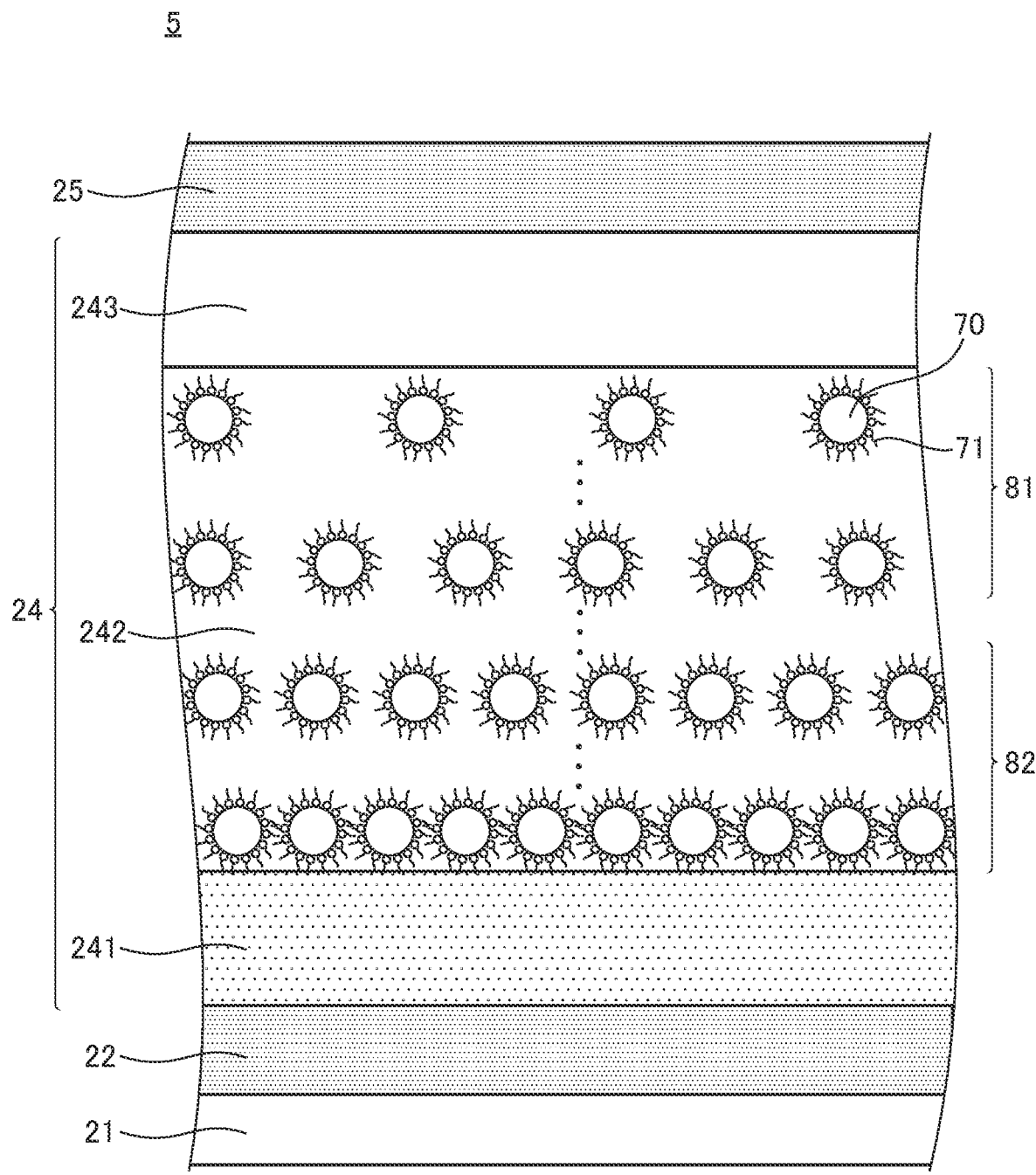
FIG. 7 is a cross-sectional view of an exemplary structure of a light-emitting element in accordance with a second embodiment.

FIG. 7 is a cross-sectional view of an exemplary structure of a light-emitting element 5 in accordance with the second embodiment. The light-emitting element 5 in accordance with the present embodiment differs from the first embodiment in the structure of the light-emitting layer 242. The light-emitting layer 242 in accordance with the present embodiment includes quantum dots 70 and ligands 71 coordinated to the quantum dots 70. In the light-emitting layer 242, the ligands 71 have a lower concentration near the electron transport layer 243 than near the hole transport layer 241. In other words, the number of the ligands 71 coordinated to the quantum dots 70 near the electron transport layer 243 is equal to the number of the ligands 71 coordinated to the quantum dots 70 near the hole transport layer 241. The terms, "same" and "equal," here may mean substantially the same and substantially equal respectively and allow for, as an example, errors of approximately ±5%.

The light-emitting layer 242 in accordance with the present embodiment has a first area 81 toward the electron transport layer 243 and a second area 82 toward the hole transport layer 241. The quantum dots 70 have a lower concentration in the first area 81 than in the second area 82. The conduction of carriers (holes and electronic) in the first area 81 is therefore restrained in comparison to the conduction in the second area 82. Hence, the first area 81 exhibits a lower conductivity than does the second area 82. In other words, the first area 81 has a higher resistivity than does the second area 82.

In this structure, similarly to the structure in accordance with the first embodiment, the electrons injected from the cathode 25 are restrained in the first area 81 from conducting into the light-emitting layer 242. The excess electrons that do not contribute to recombination therefore are restrained in the first area 81 from conducting into the light-emitting layer 242. Meanwhile, the holes injected from the anode 22 conduct into the light-emitting layer 242, but are restrained in the first area 81 from further conducting and approaching the cathode 25, thereby efficiently recombining with electrons in the light-emitting layer 242. This mechanism improves the charge-carrier balance between the electrons injected from the cathode 25 and the holes injected from the anode 22 in the light-emitting layer 242, which in turn improves the luminous efficiency of the light-emitting element 5.

To form the light-emitting layer 242 in accordance with the present embodiment, first, colloidal solutions are prepared that differ in the concentrations of the quantum dots 70 and the ligands 71 contained therein. These colloidal solutions are applied one by one to the hole transport layer 241 in the decreasing order of the concentrations of the quantum dots 70 and the ligands 71. The medium is then volatilized, which completes the formation of the light-emitting layer 242. This process can omit the oxidation step in forming the light-emitting layer 242. The colloidal solutions and their application method are substantially the same as in the first embodiment, and description thereof is therefore omitted.

Variation Examples

The description has so far discussed primary embodiments of the disclosure. The disclosure is however not limited to these embodiments.

The ligands 71 are made of an organic material in the aforementioned embodiments. The ligands 71 in accordance with the disclosure are however not necessarily limited to these embodiments. The ligands 71 may be made of, for example, an inorganic material. Specifically, the ligands 71 may be made of a metal chalcogenide compound. More specifically, the ligands 71 may be made of a metal chalcogenide compound containing any of $Sn_2S_6$, $Sn_2Se_6$, $In_2Se_4$, $In_2Te_3$, $Ga_2Se_3$, $CuInSe_2$, $Cu_7S_4$, $Hg_3Se_4$, $Sb_2Te_3$, and ZnTe. Similarly to the aforementioned embodiments, this structure can improve the luminous efficiency of the light-emitting element 5. In addition, since the ligands 71 are made of an inorganic material, the light-emitting element 5 is prevented from being degraded by oxygen and water and hence exhibits improved reliability.

The oxidation is performed by heating in an oxygen atmosphere in the aforementioned embodiments. The oxidation in accordance with the disclosure is however not necessarily limited to these embodiments. The oxidation may be performed by, for example, using oxygen, a halogen, an active oxygen species such as ozone, or an oxidizing gas. Alternatively, the oxidation may be performed by electron beam irradiation, plasma radiation, or ultraviolet radiation.

The light-emitting layer 242 is formed by stacking the quantum dots 70 and performing oxidation in the first embodiment described above. The light-emitting layer 242 may be formed by skipping the oxidation and, for example, repeatedly applying colloidal solutions containing different concentrations of ligands 71.

The oxidation is performed after the stack body containing the stacked quantum dots 70 is formed in the first embodiment. Alternatively, the oxidation may be performed after the cathodes 25 are formed. Similarly to the first embodiment, the light-emitting layer 242 can be formed by this method.

Any of the elements in the embodiments and variation examples above may be combined in a suitable manner so long as the combination works.

The invention claimed is:

1. A light-emitting element comprising:
an electron transport layer;
a hole transport layer; and
a light-emitting layer between the electron transport layer and the hole transport layer, the light-emitting layer including:
quantum dots; and
ligands coordinated with the quantum dots, wherein
the ligands in the light-emitting layer have a lower concentration on an electron transport layer side of the light-emitting layer than on a hole transport layer side of the light-emitting layer, and
the quantum dots in the light-emitting layer have a lower density on the electron transport layer side than on the hole transport layer side and a distance between nearest quantum dots of the quantum dots in the light-emitting layer gradually changes from a side of the electron transport layer to a side of the hole transport layer.

2. The light-emitting element according to claim 1, wherein the concentration of the ligands in the light-emitting layer gradually decreases from the hole transport layer side to the electron transport layer side.

3. The light-emitting element according to claim 1, wherein
the light-emitting layer has a first area on the electron transport layer side and a second area on the hole transport layer side, and
the first area has a lower conductivity than the second area.

4. The light-emitting element according to claim 3, wherein
the first area occupies at least half of a thickness of the light-emitting layer on the electron transport layer side,
the second area occupies at least less than half of the thickness of the light-emitting layer on the hole transport layer side, and
letting A represent the concentration of the ligands in the first area and B represent the concentration of the ligands in the second area, a relation, B/A>4, holds.

5. The light-emitting element according to claim 1, wherein those ligands which are coordinated with the quantum dots on the electron transport layer side are fewer than those ligands which are coordinated with the quantum dots on the hole transport layer side.

6. The light-emitting element according to claim 1, wherein those ligands which are coordinated with the quantum dots on the electron transport layer side are equal, in number per quantum dot, to those ligands which are coordinated to the quantum dots on the hole transport layer side.

7. The light-emitting element according to claim 1, wherein the ligands contain an organic material.

8. The light-emitting element according to claim 1, wherein the ligands contain a metal chalcogenide compound.

9. The light-emitting element according to claim 8, wherein the metal chalcogenide compound contains any of $Sn_2S_6$, $Sn_2Se_6$, $In_2Se_4$, $In_2Se_4$, $In_2Te_3$, $Ga_2Se_3$, $CuInSe_2$, $Cu_7S_4$, $Hg_3Se_4$, $Sb_2Te_3$, and ZnTe.

10. The light-emitting element according to claim 1, wherein, of the quantum dots, those ligands which are coordinated with the quantum dots on the electron transport layer side are of a same type as those ligands which are coordinated with the quantum dots on the hole transport layer side.

11. A display device comprising:
a thin film transistor; and
a light-emitting element according to claim 1, that is electrically connected to the thin film transistor.

12. The light-emitting element according to claim 1, wherein
the light-emitting layer is a single layer, and
a thickness of the light-emitting layer is substantially uniform.

13. The light-emitting element according to claim 1, wherein
   the light-emitting layer is a single layer, and
   a shape of the light-emitting layer is substantially uniform.

\* \* \* \* \*